(12) United States Patent
Ferrieux et al.

(10) Patent No.: US 12,381,764 B2
(45) Date of Patent: Aug. 5, 2025

(54) METHOD AND DEVICE FOR QUANTIZING DATA REPRESENTATIVE OF A RADIO SIGNAL RECEIVED BY A RADIO ANTENNA OF A MOBILE NETWORK

(71) Applicant: ORANGE, Issy-les-Moulineaux (FR)

(72) Inventors: Alexandre Ferrieux, Chatillon (FR); Fabrice Guillemin, Chatillon (FR); Veronica Karina Quintuna Rodriguez, Chatillon (FR)

(73) Assignee: ORANGE, Issy-les-Moulineaux (FR)

( * ) Notice: Subject to any disclaimer, the term of this patent is extended or adjusted under 35 U.S.C. 154(b) by 124 days.

(21) Appl. No.: 17/927,516

(22) PCT Filed: May 20, 2021

(86) PCT No.: PCT/FR2021/050903
§ 371 (c)(1),
(2) Date: May 4, 2023

(87) PCT Pub. No.: WO2021/240097
PCT Pub. Date: Dec. 2, 2021

(65) Prior Publication Data
US 2023/0261914 A1   Aug. 17, 2023

(30) Foreign Application Priority Data
May 26, 2020   (FR) .................................. 2005538

(51) Int. Cl.
*H04L 25/49*   (2006.01)
*H03M 1/00*   (2006.01)
*H04L 1/00*   (2006.01)

(52) U.S. Cl.
CPC ........ *H04L 25/4927* (2013.01); *H03M 1/007* (2013.01); *H04L 1/0002* (2013.01);
(Continued)

(58) Field of Classification Search
CPC . H04L 1/0075; H04L 25/4927; H04L 1/0002; H04L 1/0006; H04L 1/0023;
(Continued)

(56) References Cited

U.S. PATENT DOCUMENTS

| 2009/0238287 A1* | 9/2009 | Lee | H04L 25/067 375/243 |
| 2015/0117470 A1* | 4/2015 | Ryan | H04L 69/04 370/477 |

(Continued)

OTHER PUBLICATIONS

English translation of the Written Opinion of the International Searching Authority dated Sep. 21, 2021 for corresponding International Application No. PCT/FR2021/050903, filed May 20, 2021.
(Continued)

*Primary Examiner* — David B Lugo
(74) *Attorney, Agent, or Firm* — David D. Brush; Westman, Champlin & Koehler, P.A.

(57) ABSTRACT

A method for quantizing data representative of a radio signal received by a radio antenna of a mobile network. The method includes: demodulating the radio signal received by the antenna, providing a demodulated signal; scalar quantizing each value of the demodulated signal using a quantization table selected according to a channel coding level used to transmit the radio signal, providing a quantized demodulated signal; and transmitting the quantized demodulated signal to a channel decoding module.

13 Claims, 8 Drawing Sheets

(52) U.S. Cl.
CPC .......... *H04L 1/0006* (2013.01); *H04L 1/0045* (2013.01); *H04L 1/0075* (2013.01)

(58) Field of Classification Search
CPC ....... H04L 1/0045; H03M 1/007; H03M 7/50; H04W 88/085
See application file for complete search history.

(56) References Cited

U.S. PATENT DOCUMENTS

2015/0372728 A1* 12/2015 Rahman .............. H03M 7/3082
370/329
2020/0313692 A1* 10/2020 Berg ................... H03M 7/6041

OTHER PUBLICATIONS

International Search Report dated Sep. 21, 2021 for corresponding International Application No. PCT/FR2021/050903, filed May 20, 2021.
Written Opinion of the International Searching Authority dated Sep. 21, 2021 for corresponding International Application No. PCT/FR2021/050903, filed May 20, 2021.

Ling Xinyue et al., "Optimization of Quantization Levels for Quantize-and-Forward Relaying with QAM Signaling", 2018 Asia-Pacific Signal and Information Processing Association Annual Summit and Conference (APSIPA ASC), APSIPA Organization, Nov. 12, 2018 (Nov. 12, 2018), pp. 159-164, XP033525891.
Miyamoto Kenji et al., "Wireless performance and mobile fronthaul bandwidth of uplink joint reception with LLR combining in split-PHY processing", Dec. 1, 2018 (Dec. 1, 2018), vol. 20, No. 6, p. 536-545, XP011706851.
Miyamoto Kenji et al., "Unified Design of LLR Quantization and Joint Reception for Mobile Fronthaul Bandwidth Reduction", 2017 IEEE 85th Vehicular Technology Conference (VTC Spring), IEEE, Jun. 4, 2017 (Jun. 4, 2017), p. 1-5, XP033254417.
"3GPP (3rd Generation Partnership Project); Technical Specification Group Radio Access Network; Study on new radio access technology: Radio access architecture and interfaces," (Release 14), Technical Report, 3GPP TR38.801 V14.0.7, (2017-03).
Rodriguez, V. et al. "Cloud-RAN functional split for an efficient fronthaul network," 2020, IEEE.
Technical Specification, "O-RAN Fronthaul Working Group Control, User and Synchronization Plane Specification," ORAN-WG4.CUS.0-v01.00, Mar. 11, 2019.

* cited by examiner

METHOD AND DEVICE FOR QUANTIZING DATA REPRESENTATIVE OF A RADIO SIGNAL RECEIVED BY A RADIO ANTENNA OF A MOBILE NETWORK

CROSS-REFERENCE TO RELATED APPLICATIONS

This Application is a Section 371 National Stage Application of International Application No. PCT/FR2021/050903, filed May 20, 2021, which is incorporated by reference in its entirety and published as WO 2021/240097 A1 on Dec. 2, 2021, not in English.

1. FIELD OF THE INVENTION

The invention relates to the field of cellular networks and more specifically to the exchange of information between different functions of the Radio Access Network (RAN).

2. PRIOR ART

Figure 1:
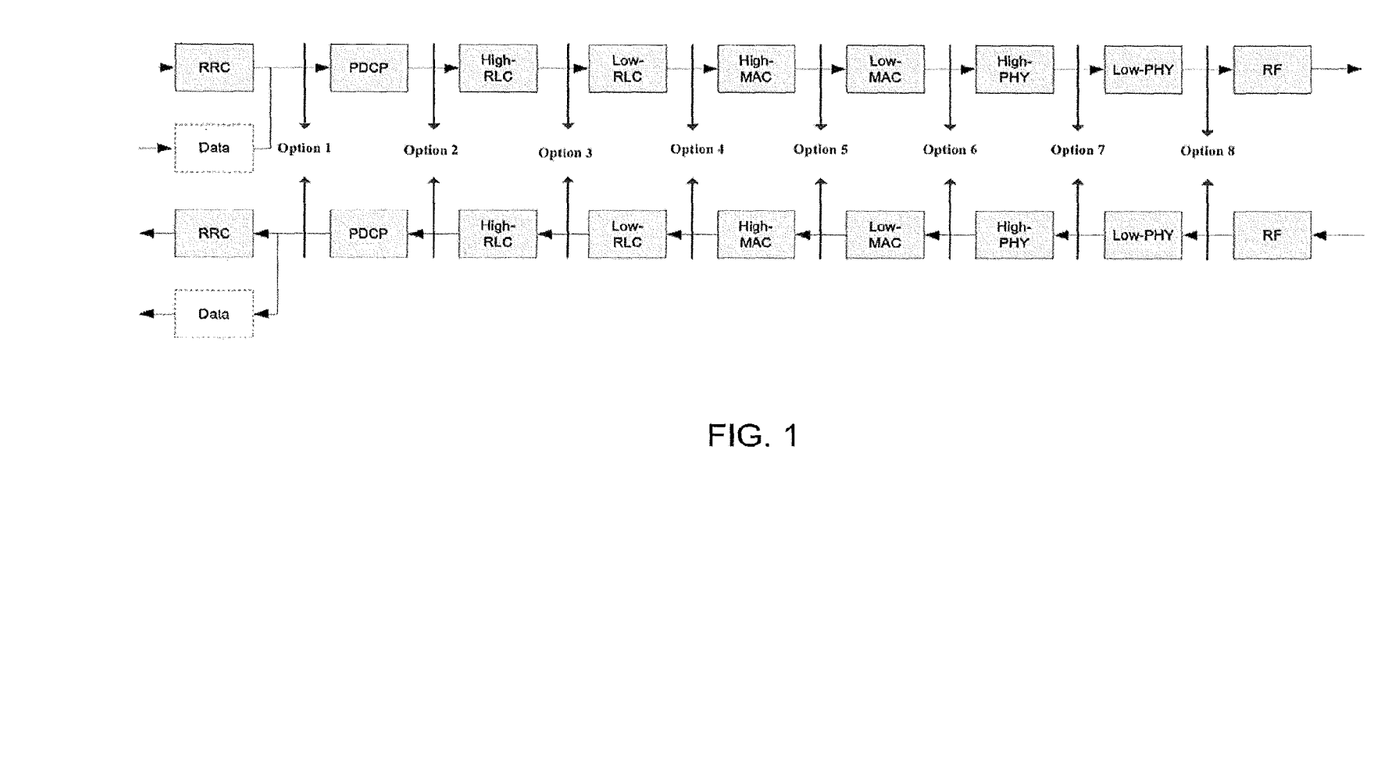

The functions of the radio access network can be broken down into several functional blocks: PDCP, RLC, MAC, (de)coding, Rate Matching, Modulation, etc. Such functional decomposition possibilities are illustrated in FIG. 1 showing the possible decomposition options described in the 3*GPP* (3*rd Generation Partnership Project*) *Study on new radio access technology: Radio access architecture and interfaces,* 3 2017, TR38.801 V14.0.7.

In actual embodiments, these different functions are performed by a single computing platform that is part of a Base Band Unit (BBU). For example, such a platform is a dedicated server at the foot of an antenna.

However, with the evolution of radio functions and the centralisation of some of these functions within centralised computing platforms (also known as Cloud-RAN) particularly to achieve economies of scale and better management of radio resources, the RAN functions can be split into several options (see 3GPP TR 38.801 specification as shown in FIG. 1).

Among these split options, a split or option 7.3 consists of separating the RAN functions into at least two blocks: the low functions ((de)modulation, analogue/digital conversion, FFT, etc.) on the one hand and the high functions on the other ((de)coding, MAC—Media Access Control, etc.) in the uplink and downlink directions. The RLC (Radio Link Control) and PDCP (Packet Data Convergence Protocol) functions can themselves be implemented even further up the network (e.g. by means of a split called option 2).

Figure 2A:
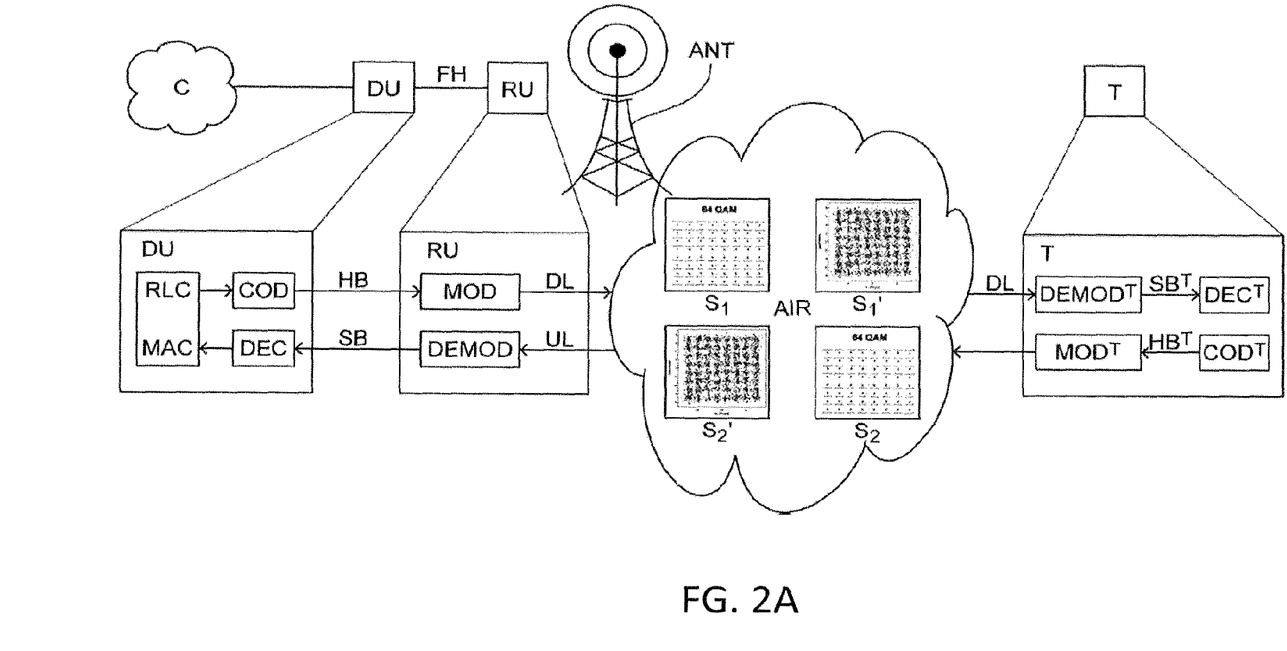

Option 7.3 is detailed in a simplified manner in FIG. 2A. It should be noted that this option 7.3 is only considered by 3GPP in the downlink direction. FIG. 2A schematically illustrates the exchange of data between a network core C and an antenna ANT via which a terminal T transmits and receives data. As shown in FIG. 2A, the modulation/demodulation and coding/decoding functions are implemented in separate units. For example, the functions of modulation (MOD) in the downlink direction (DL) and demodulation (DEMOD) in the uplink direction (UL) are implemented by a first unit (RU) and the functions of coding (COD), decoding (DEC), RLC and MAC are implemented by a second unit (DU), the high functions PDCP, RRC are implemented by a third unit (CU, not shown). In the DL downlink direction, the encoding module (COD) transmits HB data in the form of "hard bits" to the modulation module (MOD).

This hard bit HB data is a bit sequence from the channel coding implemented for the transmission of source data received from the core network over the mobile network. The modulation module (MOD) then transmits I/Q modulated symbols.

In the uplink direction UL, the demodulation module (DEMOD) receives I/Q symbols which it demodulates into "soft bit" data SB. The demodulation module (DEMOD) transmits these soft bits SBau to the decoding module (DEC). This soft bit data SB is real data, and non-binary. The inverse operations take place in the T terminal. Indeed, the terminal T receives modulated I/Q symbols from the base station, i.e. in the downlink direction DL, which are demodulated by the demodulation module (DEMOD$^T$) of the terminal into soft bits (SB$^T$). The demodulation module (DEMOD$^T$) transmits these "soft bits" (SB$^T$ to the decoding module of the terminal (DEC$^T$).

When data is transmitted by the terminal to the base station, i.e. in the uplink direction UL, the terminal's encoding module (COD$^T$) transmits hard bits (HB$^T$) to the terminal's modulation module (MOD$^T$), which modulates them into I/Q modulated symbols which are then transmitted on the radio channel.

Examples of I/Q signals are illustrated diagrammatically in FIG. 2A. For example, FIG. 2A shows:

an I/Q radio signal $S_1$ transmitted by the base station ANT and the corresponding I/Q radio signal $S_1$' received by the terminal T, and an I/Q radio signal $S_2$ transmitted by the terminal T and the corresponding I/Q radio signal $S_2$' received by the base station ANT.

It appears that the received signals $S_1$' and $S_2$' are noisy compared to the corresponding transmitted signals $S_1$ and $S_2$.

For reasons of channel decoding efficiency, the demodulation modules of the antenna and the terminal respectively transmit demodulated data, commonly known as soft bits, to the channel decoding module. The soft bits represent the Log-Likelihood Ratio (LLR) of the IQ symbols received by the antenna of the base station or terminal after demodulation of the received signal. In other words, the LLR signal represents the ratio between the probability that a particular bit in the received signal is a 1 and the probability that this bit is a 0. The use of LLR data by the decoding module can obtain good performance for the channel decoding methods. In most embodiments, this LLR data is encoded on 16 or 12 bits. When LLRs are processed locally, i.e. the demodulation and decoding functions are implemented by the same unit, this representation does not pose a problem.

However, some network function splits, as illustrated in FIG. 2A, propose to separate the demodulation function from the decoding function. The LLR data must then be transported between the high and low functions of the RAN.

Examples of the rates required to transmit LLR data are illustrated in table 1 below for a 64 QAM modulation. This rate varies according to the level of coding or Modulation and Coding Scheme (MCS).

It is clear that the rates can reach very high values, which can cause sizing problems for the fronthaul network (first part of the access network), which connects the high functions to the low functions.

TABLE 1

Required rate on the fronthaul according to
the LLR coding level for 64QAM modulation.

| LLR coding level | Rate [Gbps] |
| --- | --- |
| 1 | 4.05 |
| 2 | 8.10 |
| 3 | 12.15 |
| 4 | 16.20 |
| 5 | 20.25 |
| 6 | 24.30 |
| 7 | 28.35 |
| 8 | 32.40 |
| 9 | 36.45 |
| 10 | 40.50 |
| 11 | 44.55 |
| 12 | 48.60 |
| 13 | 52.65 |
| 14 | 56.70 |
| 15 | 60.75 |

Figure 3:
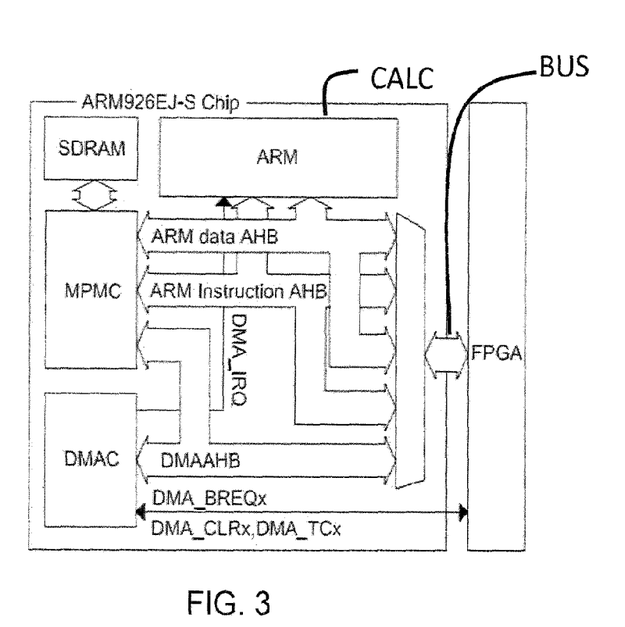

Such a problem also appears when the encoding/decoding functions are moved to an FPGA (Field Programmable Gate Array) component to save computing time, as shown in FIG. 3. FIG. 3 shows an FPGA component for encoding/decoding and a CALC computing platform performing the other RAN functions. According to such an implementation, the soft bits are transferred to the FPGA component via a communication bus (BUS). The rate required to transmit the soft bits is a brake to such implementations, as communication buses are not suitable for transmitting such large amounts of data with a reasonable latency with respect to service constraints.

Earlier techniques consisted in transferring I/Q symbols, i.e. before demodulation, between the high and low functions of the RAN, notably in the 7.2 option retained by ORAN. To reduce the bandwidth between the two groups of functions of the RAN, the ORAN method proposes to compress the I/Q symbols carried between the high and low functions of the RAN. Several compression methods are identified in the ORAN-WG4.CUS.0-v01.00 specification of ORAN (O-RAN Fronthaul Working Group, "Control, User and Synchronization Plane Specification," O-RAN, Specification, 2019). However, these methods lead to a significant degradation of the radio signal, which seems totally unrealistic in an operational context.

There is therefore a need to improve the prior art.

3. SUMMARY OF THE INVENTION

The invention improves the prior art. To this end, it relates to a method for quantizing data representative of a radio signal received by a radio antenna of a mobile network, comprising the demodulation of said radio signal received by said antenna, providing a demodulated signal, the scalar quantization of each value of said demodulated signal using a quantization table selected according to a channel coding level used to transmit said radio signal, providing a quantized demodulated signal, and transmitting said quantized demodulated signal to a channel decoding module.

The invention can thus reduce the rate required for the transmission of soft bits between the demodulation module and the channel decoding module, particularly when these modules are implemented on two separate units.

In the case where the decoding process is implemented by a specific circuit, such as an FPGA, the reduction of the coding size of the soft bits or LLRs can reduce the bandwidth on the communication bus between the FPGA component and the rest of the RAN functions and thus gain a possible multiplexing factor if several FPGA components are connected to the communication bus.

Advantageously, the quantization method according to the invention takes into account a coding level of the received radio signal to quantize the soft bits in a matching manner according to this coding level. Indeed, the channel coding functions are not deterministic and vary according to the radio channel conditions of the terminals connected to the antenna, the data load per terminal and the quantity of traffic in the cell.

According to a particular embodiment of the invention, each value of said demodulated signal is representative of a log-likelihood ratio of a symbol of said radio signal received by said antenna.

According to another particular embodiment of the invention, the channel coding level corresponds to an index representative of a combination of a modulation scheme and a channel coding rate. According to this particular embodiment of the invention, the channel coding level corresponds to an MCS index indicating the modulation scheme and the channel coding rate used to transmit the radio signal between the antenna and a terminal connected to the antenna. The coding rate is defined as the number of bits per modulated symbol. The Modulation and Coding Scheme (MCS) is a coding function that associates a codeword of N modulated symbols with a block of information of size D useful bits. The coding rate of the MCS is then the D/N ratio and is expressed in bits/symbol.

According to another particular embodiment of the invention, the quantization method comprises beforehand, the determination, for each channel coding level, of at least one scalar quantization table from a set of learning radio signals. According to this particular embodiment of the invention, the scalar quantization table is determined beforehand in a learning phase from real radio signals. This allows a quantization table to be matched to the real radio transmission conditions. This quantization table is determined in off-line mode. Thus, methods for optimising the quantization table that are costly in terms of computing time or even requiring adapted processing hardware can be used.

According to another particular embodiment of the invention, the determination of said at least one scalar quantization table comprises a minimisation of a channel decoding error rate of the learning radio signals. Thus, the quantization table is determined in such a way that the BLER of the learning radio signals is optimised. Advantageously, this particular embodiment of the invention takes into account the performance of the channel decoding. The quantization table is thus optimised from start to finish according to the quality criterion of soft bit decoding.

According to another particular embodiment of the invention, the determination of said at least one scalar quantization table comprises estimating a distribution of the absolute value of the values of the demodulated radio signal, and, for at least one quantization level corresponding to a representation of the quantized values of the demodulated signal quantized on a determined number of bits, the calculation of quantization intervals from said estimated distribution, each quantization interval noticeably comprising the same number of values of the demodulated radio signal.

According to this particular embodiment of the invention, the quantization table is determined from the distribution of the absolute values of the soft bits. This can obtain quantization intervals matched to the density of the values to be quantized. Thus, the less populated a zone of the distribution of values is (i.e. the zone has a small number of samples), the wider the quantization intervals in that zone will be. On the contrary, for a strongly populated zone, i.e. a zone with a large number of samples, the quantization intervals are small. This limits the error rate due to the quantization of the demodulated radio signal. For example, such a determination is a "companding" method. This type of method can quickly obtain quantization tables.

According to another particular embodiment of the invention, the quantization intervals are calculated using a Lloyd-Max method. Such a method is more complex than a companding method, but can obtain more optimal quantization tables than with a companding method.

According to another particular embodiment of the invention, the determination of said at least one scalar quantization table comprises the following sub-steps:
  determining a set of candidate quantization vectors, and for each candidate quantification vector:
    quantizing the demodulated learning radio signals using said quantization vector, providing quantized demodulated learning radio signals,
    calculating a distortion from said quantized demodulated learning radio signals,
  selecting the quantization vector of said set minimising said distortion.

In a variant of this other particular embodiment of the invention, the determination of said at least one scalar quantization table further comprises the decoding of said quantized demodulated learning radio signals according to the determined channel coding level, and wherein the distortion is calculated between said decoded quantized demodulated learning radio signals and said non-quantized decoded demodulated learning radio signals.

According to another variant, the sub-steps mentioned above are iterated and at each iteration, said set of candidate quantization vectors is modified according to a genetic algorithm. This type of algorithm can obtain a selected quantization vector and is optimal. Indeed, the optimisation method based on a genetic algorithm enables a gradual improvement of the adequacy of the candidate quantization vector. However, this type of method has a significant computational cost.

According to another particular embodiment of the invention, at least two scalar quantization tables are respectively determined for at least two quantization levels. The method further comprises the selection of a quantization level from the at least two quantization levels, minimizing a rate-distortion cost, where the rate corresponds to the rate used to represent the quantized values and the distortion is calculated between the values of the demodulated radio signal and the quantized values. According to this particular embodiment of the invention, several quantization levels are tested and the quantization level offering the best rate-distortion compromise is selected for quantization.

The invention relates correlatively to a method of inverse quantization of a quantized demodulated signal, implemented by a channel decoding module, comprising receiving the quantized demodulated signal from a demodulation module configured to demodulate a radio signal received by a radio antenna of a mobile network, the inverse scalar quantization of each value of said quantized demodulated signal using a de-quantization table selected according to a channel coding level used to transmit said radio signal, providing a de-quantized demodulated signal, and channel decoding of said de-quantized demodulated signal.

The invention also relates to a device for quantizing data representative of a radio signal received by a radio antenna of a mobile network. Such a device comprises a demodulation module configured to demodulate said radio signal received by said antenna, providing a demodulated signal, a processor and a memory configured to quantize each value of said demodulated signal using a scalar quantization table selected according to a channel coding level used to transmit said radio signal, providing a quantized demodulated signal, and a transmission module configured to transmit said quantized demodulated signal to a channel decoding module.

The invention also relates to a channel decoding device comprising
  a receiver of a quantized demodulated signal from a demodulation module configured to demodulate a radio signal received by a radio antenna of a mobile network,
  a processor and memory configured for:
    applying an inverse scalar quantization to each value of said quantized demodulated signal using a de-quantization table selected according to a channel coding level used to transmit said radio signal, providing a de-quantized demodulated signal, and
    applying a channel decoding of said de-quantized demodulated signal.

The invention also relates to a device of a mobile network comprising:
  at least one quantization device mentioned above,
  at least one channel decoding device in the form of a programmable circuit configured to implement a channel decoding scheme for the de-quantized demodulated signal, and
  at least one communication bus able to transmit the quantized demodulated signal from the quantization device to the channel decoding device.

The invention also relates to a server comprising at least one quantization device mentioned previously or a mobile network device mentioned above.

The invention also relates to a mobile network system comprising:
  at least one radio antenna, configured for receiving a radio signal,
  at least one unit for implementing low functions of the mobile network, comprising at least one quantization device as mentioned above, and
  at least one unit for implementing high functions of the mobile network, comprising at least one channel decoding device configured to decode a quantized demodulated signal transmitted by the quantization device.

The invention also relates to a computer program comprising instructions for the implementation of the quantization method or inverse quantization method cited above according to any one of the particular embodiments described previously, when said program is executed by a processor. These methods can be implemented in various ways, notably in wired form or in software form.

These programs can use any programming language, and can be in the form of source code, object code, or intermediate code between source code and object code, such as in a partially compiled form, or in any other desirable form.

The invention also relates to a computer-readable storage medium or data medium comprising instructions of a computer program as mentioned above. The recording media mentioned above can be any entity or device able to store the program. For example, the medium can comprise a storage means, such as a ROM, for example a CD-ROM or a microelectronic circuit ROM, or a magnetic recording means, for example a hard drive. On the other hand, the recording media can correspond to a transmissible medium such as an electrical or optical signal, that can be carried via an electrical or optical cable, by radio or by other means. The programs according to the invention can be downloaded in particular on an Internet-type network.

Alternatively, the recording media can correspond to an integrated circuit in which the program is embedded, the circuit being adapted to execute or to be used in the execution of the method in question.

4. LIST OF FIGURES

Other characteristics and advantages of the invention will emerge more clearly upon reading the following description of a particular embodiment, provided as a simple illustrative non-restrictive example, and the annexed drawings, wherein:

FIG. 1 diagrammatically illustrates different options for splitting the RAN functions, FIG. 2A diagrammatically illustrates the transmission and reception of data according to the splitting of the RAN functions in option 7.3, FIG. 2B diagrammatically compares the splitting of RAN functions under Option 7.2 and Option 7.3, FIG. 3 diagrammatically illustrates an FPGA component for encoding/decoding and a computing platform CALC performing the other RAN functions, FIG. 4A diagrammatically illustrates steps of the quantization method according to a particular embodiment of the invention, FIG. 4B diagrammatically illustrates steps to determine the quantization table used in the quantization method according to a particular embodiment of the invention.

DESCRIPTION OF AN EMBODIMENT OF THE INVENTION

The disaggregation of the RAN has raised questions since its introduction about the dimensioning of the network connecting the high and low functions of the RAN, also called the fronthaul. The first splitting of these functions introduced in the context of the RAN, namely option 8, produced gigantic rates, in the order of 10 Gbit/s per radio cell, given that an antenna is typically equipped with 3 cells covering 120°.

Subsequently, other splits were introduced, notably the option 2 that can manage the handover of a mobile terminal from one cell to another in a centralised manner and thus dispense with the X2 interface. However, this split cannot centralise the radio bandwidth allocation and coding to exploit radio resources better.

Figure 2B:
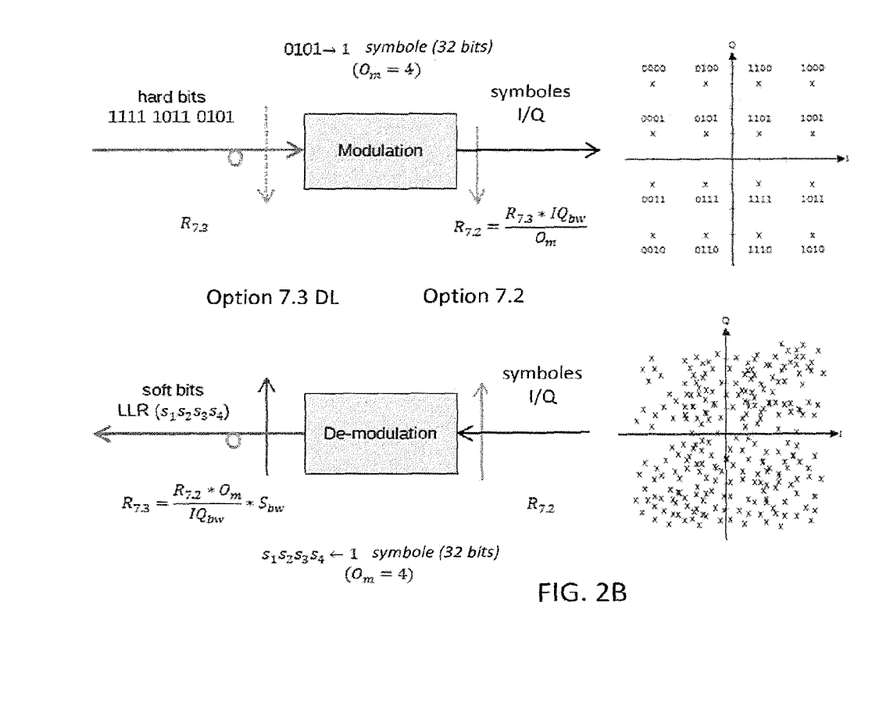

This is why the 7.x family of options was introduced. Option 7.2 is notably considered by the O-RAN standards alliance. However, as shown in FIG. 2B, option 7.2 consists in transporting I/O symbols between the high and low functions of the RAN, which can still result in very high throughputs on the fronthaul network.

To address this problem, option 7.3 was proposed in V. Quintuna et al. "Cloud-RAN functional split for an efficient fronthaul network", 2020, IWCMC. Option 7.3, also illustrated in FIG. 2B, transfers hard bits in the downlink direction and soft bits (LLR) in the uplink direction. Option 7.3 is also illustrated in FIG. 2A already discussed. A comparison of rates between options 7.2 and 7.3 is provided in tables 2, 3 and 4 below.

TABLE 2

Rates in Gbit/s of the options (splits) 7.2 and 7.3
(MIMO 8, I/Qs with 16 bits, softbits with 5 bits)

|  | Modulation | Option 7.2 | Option 7.3 |
|---|---|---|---|
| Downlink | 256QAM | 22.2 | 4.1 |
| Uplink | 64QAM | 21.6 | 20.25 |

TABLE 3

Rate comparison of options (splits)
7.2 and 7.3 (downlink direction)

| Modulation | 7.2/7.3 |
|---|---|
| QPSK (2) | 16 |
| 16QAM (4) | 8 |
| 64QAM (6) | 5.3 |
| 256QAM (8) | 4 |

TABLE 4

Rate comparison of options (splits) 7.2 and 7.3 (uplink direction).

| Modulation | 7.2/7.3 (8-bit coding) | 7.2/7.3 (4-bit coding) |
|---|---|---|
| QPSK (2) | 2 | 4 |
| 16QAM (4) | 1 | 2 |
| 64QAM (6) | 0.7 | 1.3 |
| 256QAM (8) | 0.5 | 1 |

It is clear that even with option 7.3, the rates in the upload direction can be very high.

The general principle of the invention is to introduce a variable coding of LLRs according to the coding level, while not degrading the overall coding performances (Block Error Rate for BLER).

The invention thus proposes a device for quantizing data representative of a radio signal received by a radio antenna of a mobile network.

Figure 4A:
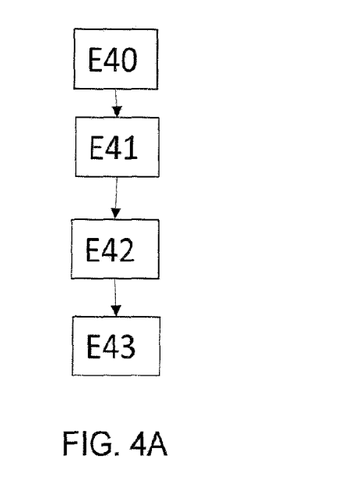

FIG. 4A diagrammatically illustrates steps of the method for quantizing data representative of a radio signal received by a radio antenna of a mobile network, according to a particular embodiment of the invention. For example, the process is implemented by the demodulation module of the base station or of the terminal shown in FIG. 2A.

In a step E40, at least one scalar quantization table is determined from a set of learning radio signals. This step is carried out during a learning phase. In a particular embodiment of the invention, a scalar quantization table is determined for each channel coding level.

A channel coding level is understood here as an index representative of a combination of a modulation scheme and a channel coding rate or MCS for Modulation and Coding Scheme. This index is exchanged between the antenna and the terminal during data transmission. It is known by the demodulation module and the channel decoding module.

At the end of the learning phase, the determined quantization table for each channel coding level is stored in a memory of the demodulation module.

In step E41, the radio signal received by the base station or terminal antenna is demodulated. The received radio frequency signal, typically comprising I/O symbols, is demodulated to provide a demodulated signal in the form of soft bits or LLRs. Each value of this demodulated signal corresponds to a log-likelihood ratio of one symbol of the radio signal received by the antenna.

In a step E42, each value of the demodulated signal is quantized using a quantization table stored in the memory of the demodulation module.

According to the particular embodiment of the invention described here, a separate quantization table is stored for each MCS channel coding level, varying from 1 to 28.

In step E42, the quantization table corresponding to the channel coding level used to transmit the radio signal received is selected to quantize the demodulated signal.

A quantized demodulated signal is obtained at the end of step E42.

In step E43, the quantized demodulated signal is transmitted to the channel decoding module to reconstruct the initially transmitted radio signal.

The quantization process thus reduces the size of the demodulated signal transmitted to the channel decoding module.

Figure 4B:
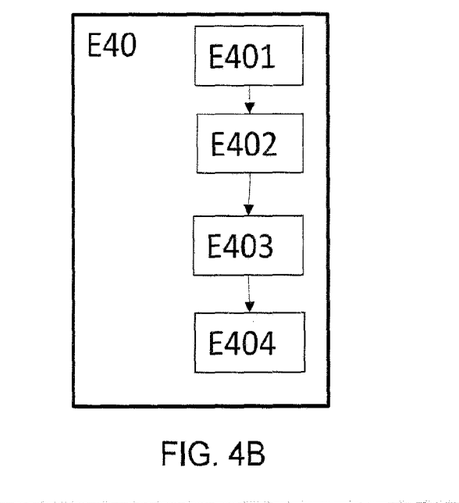

A description is given below, in relation to FIG. 4B, of steps for determining (E40) the quantization table or tables used in the quantization process described above.

In different variants, a single quantization table can be determined for all the channel coding levels, or a quantization table to be determined for each channel coding level. The variant is described here according to which a quantization table is determined for each channel coding level.

Figure 5:
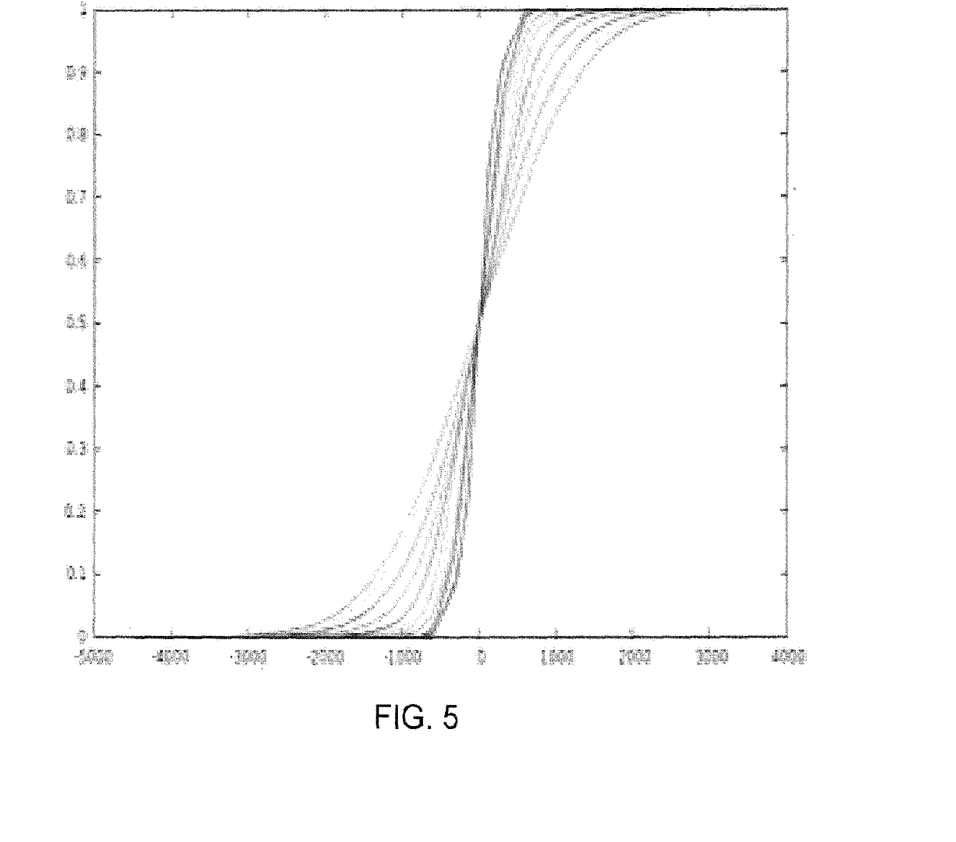
FIG. 5 illustrates an example of the cumulative probability distribution of LLRs according to the channel coding level.

According to the particular embodiment described here, the quantization table is determined by a companding method. FIG. 5 illustrates an example of cumulative probability distribution of LLRs according to MCS (coding level) obtained by simulation with the OAI open source code (for Open Air Interface). In FIG. 5, the MCS ranges from 1 to 28. FIG. 5 shows that the distribution is steeper as the MCS increases and that the distribution is symmetrical with respect to 0, thanks to bit-level scrambling.

As the distribution of LLRs is not uniform and varies according to the MCS, the companding technique is used for each MCS.

The following steps are implemented for each level of MCS channel coding.

Thus, for each channel coding level, a set of demodulated learning radio frequency signals received by an antenna is considered, providing a set of demodulated radio signals. This set of learning radio frequency signals is used to estimate the distribution of the absolute value of the LLRs for each MCS.

Figure 6:
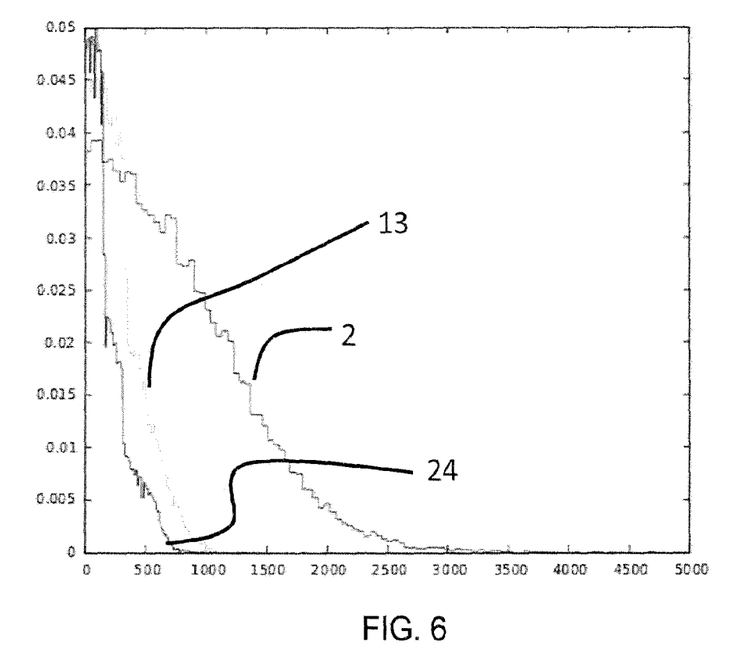
FIG. 6 illustrates an example of the probability density of LLRs for channel coding levels 2, 13 and 24.

In a step E401, the distribution of the absolute value of the values of the demodulated radio signal is estimated for each MCS. FIG. 6 illustrates an example of the probability density of LLRs for channel coding levels 2, 13 and 24. In a step E402, for at least one quantization level corresponding to a representation of the quantized values of the demodulated signal quantized over a determined number of bits, quantization intervals are calculated from the estimated distribution for each channel coding level.

In step E402, an optimal scalar quantization for each channel coding level is determined. This optimal quantization is achieved by the companding method, which consists in producing equiprobable buckets or bins from the non-uniform distribution estimated in step E401. In other words, the companding method determines quantization intervals that comprise substantially the same number of values of the demodulated radio signal.

To obtain these quantization intervals, the non-linear transformation required is the inversion of the cumulative probability distribution. In practice, it is achieved by sorting followed by regularly grouping into bins. The result is a quantization reference system or bucket list.

Figure 7:
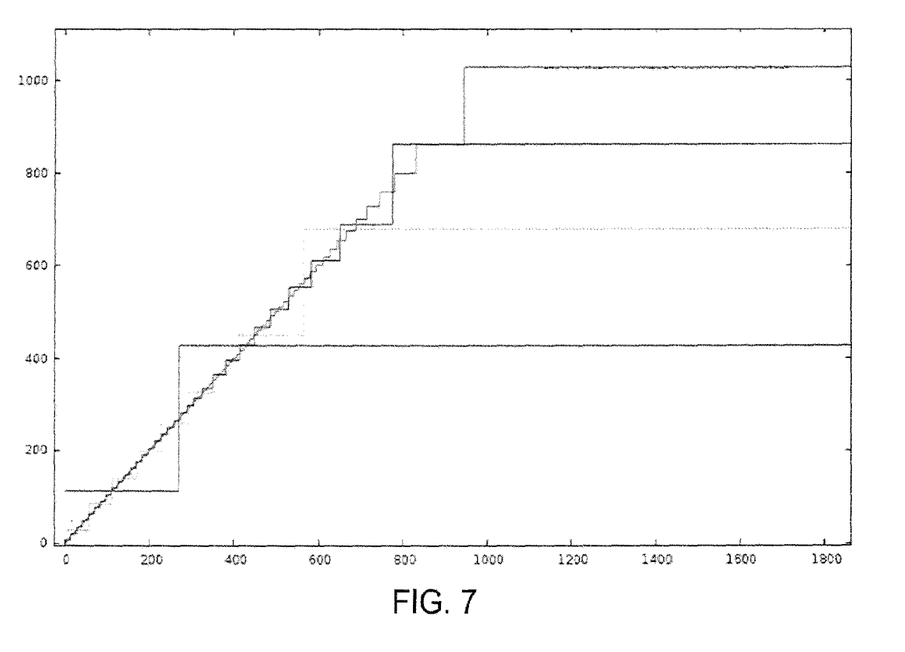
FIG. 7 illustrates examples of quantization grains for channel coding level 13.

An example of a list of buckets or quantization intervals is shown in FIG. 7 for the MCS 13 and different quantization levels corresponding to 2, 8, 32, and 128 respectively. It can be seen that the level of quantization corresponds to the number of buckets obtained. For example, a quantization with 2 levels of quantization uses two quantization intervals.

Step E402 is implemented for each coding level and for different quantization levels, for example levels 2, 8, 32 and 128.

For each channel coding level, one quantization table per quantization level is thus obtained. Each quantization table comprises the quantization intervals of the input signal values and associates with each quantization interval the index associated with the quantized value representing the values of this quantization interval.

In a step E403, for each channel coding level, a quantization table is selected from the quantization tables obtained for that channel coding level.

The quantization table is selected so that it minimizes a rate-distortion cost, where the rate corresponds to the rate used to represent the quantized values and the distortion is calculated between the values of the demodulated radio signal and the quantized values.

Figure 8:
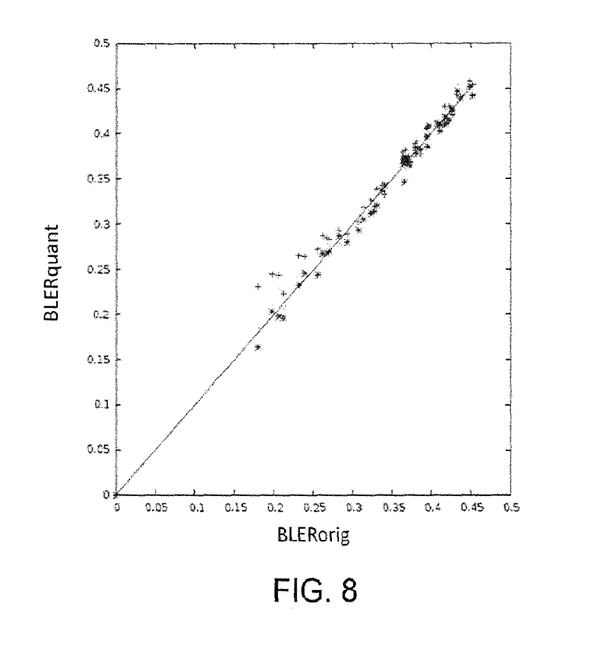
FIG. 8 illustrates a comparison of the BLER before and after quantization of the LLRs.

In another embodiment, the table can be selected by considering the channel decoding error introduced by the quantization. The decoding error can indeed be measured to verify that the quantization of the LLR signal does not degrade the overall performance of the channel coding. The channel decoding error is measured, for example, by the Block Error Rate (BLER) from the signal decoded by the channel decoding module FIG. 8 shows a comparison of the BLER before (BLERorig) and after LLR quantization (BLERquant) for different quantization levels (2, 4 and 8). In FIG. 8, it can be seen that a quantization based on 8 bins offers a good compromise, inducing a minimal additional error while allowing a 4-bit encoding of the LLRs (1 sign bit+3 absolute value bits). This reduces the bandwidth for transporting LLRs by a factor of 4 compared to the initial 16-bit coding.

In step E404, the selected quantization table for each MCS is stored in a memory of the demodulation module.

According to the particular embodiment described here, the determination of the quantization table was carried out by a "companding" method. Other variants of the invention are possible for obtaining the quantization table. In particular, a Lloyd-Max type method can be used to define the quantization intervals.

The Lloyd-Max method determines an optimal scalar quantizer by minimising a distortion. Such a distortion is calculated between the input signal, i.e. the absolute values of the demodulated radio signal values, and the reconstructed signal, i.e. the absolute values of the demodulated radio signal values quantized and de-quantized.

Figure 9:
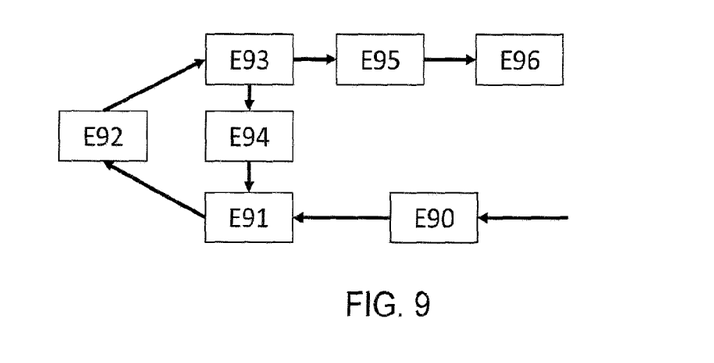
FIG. 9 diagrammatically illustrates steps to determine the quantization table used in the quantization method according to another particular embodiment of the invention, FIG. 10 diagrammatically illustrates steps of the inverse quantization method according to a particular embodiment of the invention, FIG. 11A diagrammatically illustrates a quantization device according to a particular embodiment of the invention, FIG. 11B diagrammatically illustrates a mobile network device according to a particular embodiment of the invention, FIG. 12 diagrammatically illustrates a quantization device according to a particular embodiment of the invention.

FIG. 9 diagrammatically illustrates steps to determine the quantization table used in the quantization method according to another particular embodiment of the invention.

According to this particular embodiment of the invention, the quantization table(s) are determined so as not to degrade the overall performance of the channel coding, as measured by the BLER (Block Error Rate) block. In particular, according to this particular embodiment, the quantization table is determined during the learning phase according to an end-to-end optimisation taking into account the global performance of the channel coding. According to this particular embodiment of the invention, the complete decoding chain is integrated in the optimisation loop, in order to find the optimal parameters for the quality criterion of the LLR decoding. Due to its structure (Turbo-Decoder, LDPC, Polar Codes), the decoding quality is a non-differentiable function of the input parameters which are the quantization steps of the LLRs. Thus, any classical gradient descent based optimisation method is excluded.

"Gradient-free" methods are used, such as genetic algorithms, but other optimisation methods are also possible (e.g. simulated annealing). In these methods, one considers a set of vectors in the parameter space that are "candidates", and a "matching function" defined on this space, that is sought to be maximised.

A vector in the parameter space corresponds to a quantization table defining the quantization intervals or quantization steps for quantizing the LLR signal values.

According to this particular embodiment, the quantization table is determined for a channel coding level determined from a set of learning LLR signals. In different variants, a single quantization table can be determined for all the channel coding levels, or a quantization table can be determined for each channel coding level. The variant is described here according to which a quantization table is determined for each channel coding level.

The set of learning LLR signals used in the optimisation process described below corresponds to radio signals, typically I/O symbols, transmitted according to the channel coding level considered and demodulated to provide a demodulated signal in the form of soft bits or LLR. Each value of this demodulated signal corresponds to a log-likelihood ratio of one symbol of the radio signal received by the antenna.

In a step E90, a set of candidate quantization vectors is determined.

At initialisation, a set of candidate quantization tables is therefore determined, for example by a "companding" method.

Then, for each candidate quantization vector, in a step E91, the learning LLR signals are quantized using the candidate quantization vector, providing quantized learning LLR signals.

In a step E92, the quantized learning LLR signals are decoded according to the channel coding level. Prior to channel decoding, these quantized LLR signals are de-quantized.

In a step E93, an error is calculated between the decoded quantized learning LLR signals and the decoded non-quantized learning LLR signals, according to the chosen matching function.

In a step E95, the quantization vector is selected from the set of candidate quantization vectors that minimizes the error between the decoded quantized learning LLR signals and the decoded non-quantized learning LLR signals.

According to a variant of this particular embodiment of the invention, the optimisation phase is based on a genetic algorithm. According to this particular embodiment of the invention, the quantization vector is selected in step E95, if a stop criterion of the algorithm is met. Such a stop criterion may include a maximum number of iterations of the algorithm reached, a convergence criterion of the algorithm reached.

If the stop criterion is not met, in a step E94, an optimisation of the candidate quantization vectors is performed, and the method iterates steps E91-E93 for the new set of candidate quantization vectors.

In the case of genetic algorithms as used in the invention, the set of candidate quantization vectors is "evolved" as a "population of individuals" by applying principles from evolutionary theory: probability of reproduction proportional to the matching function, random mutations, random hybridizations. Such a method produces an incremental improvement in the suitability of the best candidate quantization vector. At convergence, there is a local optimum.

The implementation of this variant consists in using a "gradient-free" method e.g., the genetic algorithm on a representative dataset, here the LLRs learning signals. The matching function is an evaluation of the performance of a decoder of the type considered (Turbo/LDPC/Polar), and determined by the level of MCS channel coding considered. The large number of evaluations required (many individuals and generations) may necessitate the use of accelerated hardware for decoding during this optimisation phase.

But once convergence is achieved or the stop criterion is met, the optimal candidate quantization vector is extracted for each MCS, and in a step E96, stored by the demodulation module.

This optimal quantization vector is then used in a real-time system: it is a quantization table.

The variant described in relation to FIG. 9 is described in the case of the minimisation of the BLER. In one embodiment, the optimisation method described in FIG. 9 can be implemented by minimising the error between the learning LLR signals at the input and the quantised and de-quantised learning LLR signals. In this variant, it is unnecessary to decode the channel of the quantized learning LLR signals. This variant is simpler in terms of computational cost, but the selected quantization vector does not take into account the performances of the channel decoding.

Figure 10:
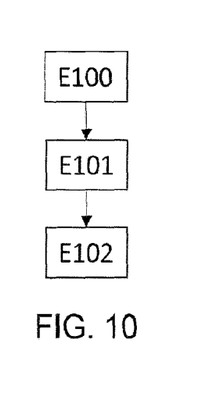

FIG. 10 diagrammatically illustrates steps of the inverse quantization method according to a particular embodiment of the invention. When the channel decoding module receives the quantized LLR signal according to the method described in relation to FIG. 4A, the channel decoding module shall perform the inverse quantization of the quantized signal.

To this end, in a step E100, the channel decoding module receives the quantized demodulated signal from the demodulation module.

In a step E101, the channel decoding module performs the inverse scalar quantization of each value of said quantized demodulated signal using a de-quantization table selected according to the channel coding level used to transmit the radio signal from where the LLR signal comes. Inverse quantization consists of replacing each index or quantization step of the quantized signal with its "real" value, that is the value representing the quantization interval associated with the quantization step. The de-quantized demodulated signal is thus obtained.

In a step E102, the channel decoding module decodes the de-quantized demodulated signal.

Figures 11A, 11B:
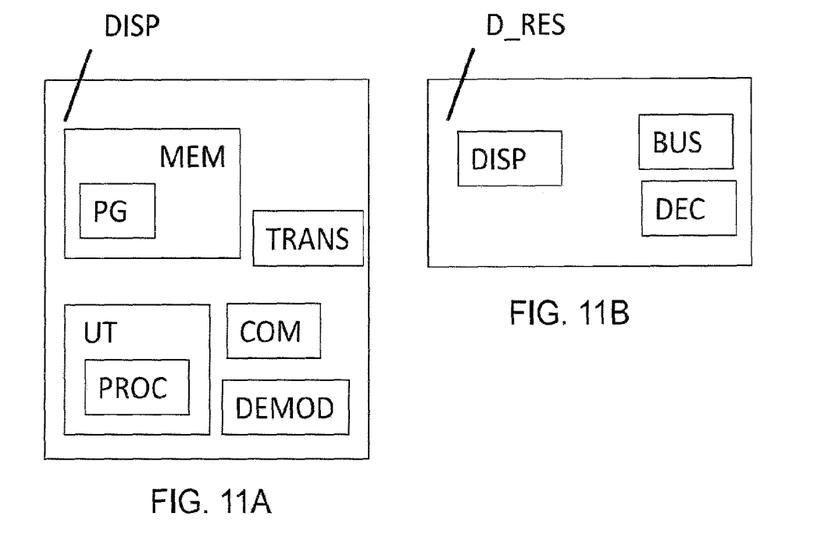

FIG. 11A shows the simplified structure of a quantization device DISP adapted to implement the quantization method according to any one of the particular embodiments of the invention. According to a particular embodiment of the invention, the steps of the quantization method are implemented by computer program instructions. For this purpose, the device DISP has the standard architecture of a computer and notably comprises a memory MEM, a processing unit UT, equipped for example with a processor PROC, and driven by the computer program PG stored in the memory MEM. The computer program PG comprises instructions for implementing the steps of the quantization method as described above, when the program is executed by the processor PROC.

At initialisation, the code instructions of the computer program PG are for example loaded into a memory before being executed by the processor PROC. In particular, the processor PROC of the processing unit UT implements the steps of the quantization method described above, according to the instructions of the computer program PG.

The device DISP includes an interface COM for receiving a radio signal and a radio demodulation module DEMOD configured to demodulate the radio signal. The demodulation module DEMOD can be in the form of software modules or dedicated circuits.

The device DISP also includes a transmission module TRANS configured to transmit the quantized demodulated signal to a channel decoding module located in a separate unit. For example, the transmission module TRANS is configured to transmit the quantized demodulated signal via a fronthaul network of a data network.

The memory MEM of the device DISP is configured to store one or more quantization tables for quantizing the demodulated signals.

According to a particular embodiment of the invention, the quantization device is comprised in a server.

FIG. 11B shows the simplified structure of a mobile network device D_RES comprising at least one quantization device DISP adapted to implement the quantization method according to any one of the particular embodiments of the invention.

This mobile network device D_RES further comprises at least one channel decoding device DEC in the form of a programmable circuit configured to implement a channel decoding scheme of the de-quantized demodulated signal, and at least one communication bus BUS able to transmit the quantized demodulated signal from the quantizing device to the channel decoding device.

According to a particular embodiment of the invention, the mobile network device is comprised in a server.

Figure 12:
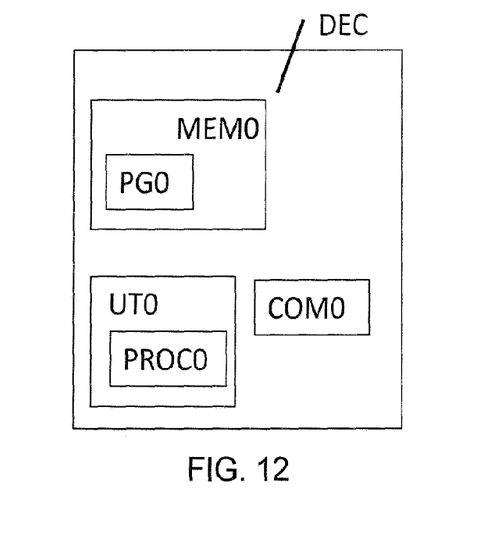

FIG. 12 diagrammatically illustrates a channel decoding device DEC according to a particular embodiment of the invention.

According to a particular embodiment of the invention, the steps of the inverse quantization method are implemented by computer program instructions. For this purpose, the device DEC has the standard architecture of a computer and notably comprises a memory MEM0, a processing unit UT0, equipped for example with a processor PROC0, and driven by the computer program PG0 stored in the memory MEM0. The computer program PG0 comprises instructions for implementing the steps of the inverse quantization method as described above, when the program is executed by the processor PROC0.

At initialisation, the code instructions of the computer program PG0 are for example loaded into a memory before being executed by the processor PROC0. In particular, the processor PROC0 of the processing unit UT0 notably implements the steps of the inverse quantization method described above, according to the instructions of the computer program PG0.

The DEC device also comprises an interface COM0 configured to receive a quantized demodulated signal.

The DEC device is also configured to implement a channel decoding scheme to decode the de-quantized signal. The channel decoding scheme can be in the form of software modules or dedicated circuits.

The memory MEM of the device DEC is configured to store one or more quantization tables for de-quantizing the quantized demodulated signals.

According to a particular embodiment of the invention, the device DEC is comprised in a server.

The invention claimed is:

1. A method implemented by a device of a mobile network and comprising:
   receiving a radio signal from a radio antenna of the mobile network;
   demodulating said radio signal received by said antenna, providing a demodulated signal;
   performing a scalar quantization of each value of said demodulated signal using a quantization table selected according to a channel coding level used to transmit said radio signal, providing a quantized demodulated signal;
   transmitting said quantized demodulated signal to a channel decoding module; and
   before performing the scalar quantization, determining, for each channel coding level, at least one scalar quantization table from a set of learning radio signals, wherein the determining said at least one scalar quantization table comprises:
      estimating a distribution of an absolute value of the values of the demodulated radio signal, and,
      for at least one quantization level corresponding to a representation of the quantized values of the demodulated signal quantized on a determined number of bits, calculating quantization intervals from said estimated distribution, each quantization interval comprising a same number of values of the demodulated radio signal.

2. The method according to claim 1, wherein each value of said demodulated signal is representative of a log-likelihood ratio of a symbol of said radio signal received by said antenna.

3. The method according to claim 1, wherein each channel coding level corresponds to an index representative of a combination of a modulation scheme and a channel coding rate.

4. The method according to claim 1, wherein the determining of said at least one scalar quantization table comprises a minimization of a channel decoding error rate of the learning radio signals.

5. The method according to claim 1, wherein the determining of said at least one scalar quantization table is performed using a Lloyd-Max type method.

6. The method according to claim 1, wherein at least two scalar quantization tables are respectively determined for at least two quantization levels, the method further comprising selecting a quantization level from the at least two quantization levels, minimizing a rate-distortion cost, where the rate corresponds to a rate used to represent the quantized values and the distortion is calculated between the values of the demodulated radio signal and the quantized values.

7. A device for quantizing data representative of a radio signal received by a radio antenna of a mobile network, comprising:
   a demodulator configured to demodulate said radio signal received by said antenna, providing a demodulated signal;
   a processor and a memory configured to quantize each value of said demodulated signal using a scalar quantization table selected according to a channel coding level used to transmit said radio signal, providing a quantized demodulated signal; and
   a transmitter configured to transmit said quantized demodulated signal to a channel decoding module,
   and wherein the processor and the memory are further configured to determine at least one scalar quantization table for each channel coding level from a set of learning radio signals by:
      estimating a distribution of an absolute value of the values of the demodulated radio signal, and,
      for at least one quantization level corresponding to a representation of the quantized values of the demodulated signal quantized on a determined number of bits, calculating quantization intervals from said estimated distribution, each quantization interval comprising a same number of values of the demodulated radio signal.

8. A mobile network device comprising:
   at least one quantization device for quantizing data representative of a radio signal received by a radio antenna of a mobile network, the at least one quantization device comprising:
      a demodulator configured to demodulate said radio signal received by said antenna, providing a demodulated signal;
      a processor and a memory configured to quantize each value of said demodulated signal using a scalar quantization table selected according to a channel coding level used to transmit said radio signal, providing a quantized demodulated signal, and to determine at least one scalar quantization table for each channel coding level from a set of learning radio signals by:
         estimating a distribution of an absolute value of the values of the demodulated radio signal, and,
         for at least one quantization level corresponding to a representation of the quantized values of the demodulated signal quantized on a determined number of bits, calculating quantization intervals from said estimated distribution, each quantization interval comprising a same number of values of the demodulated radio signal; and
      a transmitter configured to transmit said quantized demodulated signal to a channel decoding module;
   the channel decoding device in the form of a programmable circuit configured to implement a channel decoding scheme of the demodulated signal, and
   at least one communication bus able to transmit the quantized demodulated signal from the at least one quantization device to the channel decoding device.

9. A method implemented by a device of a mobile network and comprising:
   receiving a radio signal from a radio antenna of the mobile network;
   demodulating said radio signal received by said antenna, providing a demodulated signal;
   performing a scalar quantization of each value of said demodulated signal using a quantization table selected according to a channel coding level used to transmit said radio signal, providing a quantized demodulated signal;
   transmitting said quantized demodulated signal to a channel decoding module; and
   before performing the scalar quantization, determining, for each channel coding level, at least one scalar quantization table from a set of learning radio signals, wherein the determining of said at least one scalar quantization table comprises the following sub-steps:
      determining a set of candidate quantization vectors, and for each candidate quantization vector:
         quantizing the demodulated learning radio signals using said quantization vector, providing quantized demodulated learning radio signals,
         calculating a distortion from said quantized demodulated learning radio signals,
      selecting the quantization vector of said set minimizing said distortion.

10. The method according to claim 9, the determining of said at least one scalar quantization table further comprising decoding said quantized demodulated learning radio signals according to the determined channel coding level, and wherein the distortion is calculated between said decoded quantized demodulated learning radio signals and said non-quantized decoded demodulated learning radio signals.

11. The method according to claim 9, wherein the sub-steps are iterated, and at each iteration, said set of candidate quantization vectors is modified according to a genetic algorithm.

12. A device for quantizing data representative of a radio signal received by a radio antenna of a mobile network, comprising:
   a demodulator configured to demodulate said radio signal received by said antenna, providing a demodulated signal;
   a processor and a memory configured to quantize each value of said demodulated signal using a scalar quantization table selected according to a channel coding level used to transmit said radio signal, providing a quantized demodulated signal; and
   a transmitter configured to transmit said quantized demodulated signal to a channel decoding module,
   and wherein the processor and the memory are further configured to determine at least one scalar quantization table for each channel coding level from a set of learning radio signals by:
      determining a set of candidate quantization vectors, and for each candidate quantization vector:
         quantizing the demodulated learning radio signals using said quantization vector, providing quantized demodulated learning radio signals,
         calculating a distortion from said quantized demodulated learning radio signals,
      selecting the quantization vector of said set minimizing said distortion.

13. A mobile network device comprising:
at least one quantization device for quantizing data representative of a radio signal received by a radio antenna of a mobile network, the at least one quantization device comprising:
- a demodulator configured to demodulate said radio signal received by said antenna, providing a demodulated signal;
- a processor and a memory configured to quantize each value of said demodulated signal using a scalar quantization table selected according to a channel coding level used to transmit said radio signal, providing a quantized demodulated signal, and to determine at least one scalar quantization table for each channel coding level from a set of learning radio signals by:
    determining a set of candidate quantization vectors, and for each candidate quantization vector:
        quantizing the demodulated learning radio signals using said quantization vector, providing quantized demodulated learning radio signals,
        calculating a distortion from said quantized demodulated learning radio signals,
    selecting the quantization vector of said set minimizing said distortion; and
- a transmitter configured to transmit said quantized demodulated signal to a channel decoding module;

the channel decoding device in the form of a programmable circuit configured to implement a channel decoding scheme of the demodulated signal, and at least one communication bus able to transmit the quantized demodulated signal from the at least one quantization device to the channel decoding device.

* * * * *